(12) United States Patent
Kezobo et al.

(10) Patent No.: US 10,259,492 B2
(45) Date of Patent: Apr. 16, 2019

(54) MOTOR CONTROL DEVICE, ELECTRIC POWER STEERING DEVICE AND INVERTER SYSTEM FAILURE DETECTION METHOD

(71) Applicant: Mitsubishi Electric Corporation, Tokyo (JP)

(72) Inventors: Isao Kezobo, Tokyo (JP); Yoshihiko Kimpara, Tokyo (JP); Shunsuke Nakajima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/510,905

(22) PCT Filed: Nov. 4, 2014

(86) PCT No.: PCT/JP2014/079192
§ 371 (c)(1),
(2) Date: Mar. 13, 2017

(87) PCT Pub. No.: WO2016/071949
PCT Pub. Date: May 12, 2016

(65) Prior Publication Data
US 2017/0282968 A1 Oct. 5, 2017

(51) Int. Cl.
*B62D 5/04* (2006.01)
*H02P 29/024* (2016.01)
(Continued)

(52) U.S. Cl.
CPC .......... *B62D 5/0484* (2013.01); *B62D 5/046* (2013.01); *G01R 31/00* (2013.01); *G01R 31/006* (2013.01);
(Continued)

(58) Field of Classification Search
CPC .... B62D 5/0484; B62D 5/046; G01R 31/006; G01R 31/343; H02P 6/14; H02P 29/024; H02P 6/12
(Continued)

(56) References Cited

U.S. PATENT DOCUMENTS

2004/0027083 A1\* 2/2004 Suzuki ................ B62D 5/0487
318/400.22
2004/0178809 A1\* 9/2004 Fujino .................. H02M 7/537
324/710
(Continued)

FOREIGN PATENT DOCUMENTS

EP 2 594 459 A2 5/2013
JP 3108964 B2 11/2000
(Continued)

OTHER PUBLICATIONS

International Search Report for PCT/JP2014/079192 dated Jan. 27, 2015 [PCT/ISA/210].
(Continued)

*Primary Examiner* — Kawing Chan
*Assistant Examiner* — Bradley Brown
(74) *Attorney, Agent, or Firm* — Sughrue Mion, PLLC; Richard C. Turner

(57) ABSTRACT

An inverter system failure is detected on the basis of the currents of respective phases detected by a current detection unit when carrying out switching control in accordance with a first drive mode in which all switching elements on a lower-side arm are switched on and all switching elements on an upper-side arm are switched off, and the currents of respective phases detected by the current detection unit when carrying out switching control in accordance with a second drive mode in which all of the switching elements on
(Continued)

the upper-side arm are switched on and all of the switching elements on the lower-side arm are switched off.

8 Claims, 5 Drawing Sheets

(51) Int. Cl.
    *H02P 6/12*     (2006.01)
    *H02P 6/14*     (2016.01)
    *G01R 31/00*     (2006.01)
    *G01R 31/34*     (2006.01)
    *H02P 27/06*     (2006.01)

(52) U.S. Cl.
    CPC .............. *G01R 31/343* (2013.01); *H02P 6/12* (2013.01); *H02P 6/14* (2013.01); *H02P 27/06* (2013.01); *H02P 29/024* (2013.01)

(58) Field of Classification Search
    USPC .................................................... 318/400.27
    See application file for complete search history.

(56) References Cited

U.S. PATENT DOCUMENTS

2010/0117574 A1    5/2010   Gunji
2011/0248657 A1*  10/2011   Endoh .................. B62D 5/0487
                                                    318/400.22

FOREIGN PATENT DOCUMENTS

| JP | 2003-324928 A | 11/2003 |
|----|---------------|---------|
| JP | 2004-201427 A | 7/2004  |
| JP | 2009-001055 A | 1/2009  |
| JP | 2010-081739 A | 4/2010  |
| JP | 2011-223707 A | 11/2011 |
| JP | 2013-110820 A | 6/2013  |

OTHER PUBLICATIONS

Written Opinion for PCT/JP2014/079192 dated Nov. 4, 2014 [PCT/ISA/237].

* cited by examiner

FIG. 2A

| SWITCHING CONTROL | FAILURE DETERMINATION CONDITION | RESULT A | RESULT B | RESULT C | RESULT D |
|---|---|---|---|---|---|
| FIRST DRIVE MODE | FIRST FAILURE DETERMINATION CONDITION (Iu+Iv+Iw=0) | ESTABLISHED | ESTABLISHED | NOT ESTABLISHED | NOT ESTABLISHED |
| SECOND DRIVE MODE | SECOND FAILURE DETERMINATION CONDITION (Iu=Iv=Iw=0) | ESTABLISHED | NOT ESTABLISHED | ESTABLISHED | NOT ESTABLISHED |
| FAILURE DETERMINATION RESULT | | NORMAL | LOWER-ARM SHORTING FAILURE | UPPER-ARM SHORTING FAILURE | CURRENT SENSOR SYSTEM FAILURE |

FIG. 2B

| FAILURE PATTERN OF CURRENT SENSOR SYSTEM FAILURE | FIRST DRIVE MODE | SECOND DRIVE MODE |
|---|---|---|
| FAILURE PATTERN 1 (CURRENT VALUE IS OTHER THAN 0) | — | PHASE WHERE CURRENT VALUE IS OTHER THAN ZERO IDENTIFIED AS CURRENT DETECTION ABNORMALITY PHASE |
| FAILURE PATTERN 2 (CURRENT VALUE IS FIXED TO ZERO) | PHASE WHERE CURRENT VALUE IS FIXED TO ZERO IDENTIFIED AS CURRENT DETECTION ABNORMALITY PHASE | — |

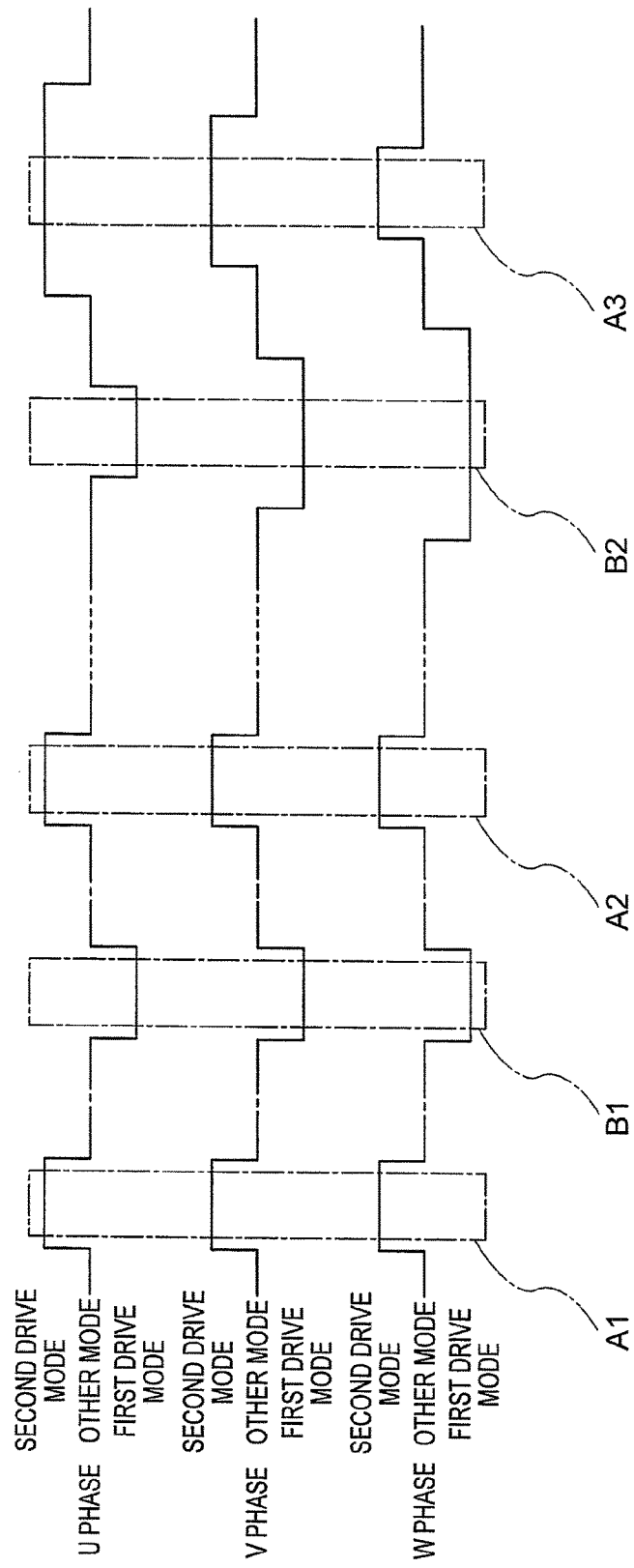

MOTOR CONTROL DEVICE, ELECTRIC POWER STEERING DEVICE AND INVERTER SYSTEM FAILURE DETECTION METHOD

CROSS REFERENCE TO RELATED APPLICATIONS

This application is a National Stage of International Application No. PCT/JP2014/079192 filed Nov. 4, 2014, the contents of all of which are incorporated herein by reference in their entirety.

TECHNICAL FIELD

The present invention relates to a motor control device which detects failure in an inverter circuit, an electric power steering device provided with this motor control device, and an inverter system failure detection method.

BACKGROUND ART

Conventionally, various technologies have been proposed for detecting failure in an inverter circuit, such as failure of a switching element or failure of a current sensor (see, for example, PTL 1 and PTL 2).

Furthermore, conventionally, when a failure in an inverter circuit has been detected, if the failure in the inverter circuit occurs in a single phase, for example, then drive control of the motor can be continued in the remaining two phases, which are normal phases.

Here, if the drive control of the motor is interrupted completely when the failure of the inverter circuit is in one phase, then the motor cannot rotate under its own torque thereafter. In particular, in the case of an electric power steering device, turning the steering wheel by the driver's steering force alone places a large burden on the driver. Therefore, motor drive control is continued in the remaining two phases, which are normal phases.

Furthermore, when continuing the motor drive control, it is necessary to switch from the normal drive control to drive control corresponding to failure after a failure has been detected in the inverter circuit, and therefore a failure of this kind must be detected rapidly. In other words, the greater the delay in the detection of a failure in the inverter circuit, the less possible it becomes to continue drive control of the motor in an appropriate fashion.

CITATION LIST

Patent Literature

[PTL 1] JP 3108964 B2
[PTL 2] JP 5023833 B2

SUMMARY OF INVENTION

Technical Problem

However, the prior art involves the following problems.

In the prior art disclosed in PTL 1 and PTL 2, the method for detecting a failure in the inverter circuit involves a complex configuration and the detection time required to detect a failure in an inverter circuit is long, which causes a problem in that a failure in an inverter circuit cannot be detected rapidly.

The present invention was devised in order to resolve the abovementioned problem, an object thereof being to provide a motor control device, an electric power steering device using the motor control device, and an inverter system failure detection method, whereby a failure in an inverter circuit can be detected simply and rapidly compared to the prior art.

Solution to Problem

The motor control device according to the present invention is a motor control device which controls driving of a motor having multiple-phase windings by using detection values of currents flowing in respective phases of the motor, the motor control device including: an inverter in which a plurality of circuits, each having switching elements respectively on an upper-side arm and a lower-side arm, are connected in parallel, and which supplies power to the motor; a motor control unit which controls driving of the motor by controlling the inverter; and a current detection unit which is connected to each of the switching elements on the lower-side arm and which detects the current in each of the phases, wherein the motor control unit has: a first drive mode in which switching control is carried out to switch on all of the switching elements on the lower-side arm, and to switch off all of the switching elements on the upper-side arm; and a second drive mode in which switching control is carried out to switch on all of the switching elements on the upper-side arm, and to switch off all of the switching elements on the lower-side arm, and the motor control unit: carries out a first failure determination for determining whether or not the sum of the currents of the respective phases detected as a first failure detection current by the current detection unit is within a previously established first threshold value range, when switching control is carried out in accordance with the first drive mode; carries out a second failure determination for determining whether or not each of the currents of the respective phases detected as a second failure detection current by the current detection unit is within a previously established second threshold value range, when switching control is carried out in accordance with the second drive mode; and detects an inverter system failure in accordance with the determination results of the first failure determination and the second failure determination.

The electric power steering device according to the present invention is provided with the abovementioned motor control device, and a motor having multiple-phase windings which is controlled by the motor control device.

The inverter system failure detection method according to the present invention is an inverter system failure detection method which is executed by a motor control device including an inverter in which a plurality of circuits, each having switching elements respectively on an upper-side arm and a lower-side arm, are connected in parallel, and which supplies power to a motor, and a current detection unit which is connected to each of the switching elements on the lower-side arm and which detects currents in respective phases of the motor, the method including: a step of carrying out first failure determination for determining whether or not the sum of the currents of the respective phases detected as a first failure detection current by the current detection unit is within a first threshold value range, when all of the switching elements on the lower-side arm are switched on and all of the switching elements on the upper-side arm are switched off; a step of carrying out second failure determination for determining whether or not each of the currents of the respective phases detected as a second failure detection current by the current detection unit is within a second threshold value range, when all of the switching elements on the upper-side arm are switched on and all of the switching elements on the lower-side arm are switched off; and a step of detecting an inverter system failure in accordance with the determination results of the first failure determination and the second failure determination.

Advantageous Effects of Invention

According to the present invention, provided is a configuration wherein an inverter is controlled in drive modes based on previously established two types of switching patterns, and an inverter system failure can be detected on the basis of the current detection results in each phase on a lower-side arm of the inverter in these two types of switching patterns. Consequently, it is possible to obtain a motor control device capable of detecting a failure in an inverter circuit, simply and rapidly compared to the prior art, and an electric power steering device provided with the motor control device, and an inverter system failure detection method.

BRIEF DESCRIPTION OF DRAWINGS

FIG. 2A is an illustrative diagram depicting the details of detection of an inverter system failure by a motor control unit according to the first embodiment of the present invention.

FIG. 2B is an illustrative diagram depicting a method for identifying a current detection abnormality phase when a current sensor system failure has been detected by the motor control unit according to the first embodiment of the present invention.

FIG. 3 is an illustrative diagram depicting one example of the timing at which switching control based on the first drive mode and the second drive mode is carried out by the motor control unit in the first embodiment of the present invention.

DESCRIPTION OF EMBODIMENTS

Below, a motor control device, an electric power steering device provided with the motor control device, and an inverter system failure detection method according to the present invention will be described with reference to the drawings, on the basis of preferred embodiments. In the illustration, parts which are the same or corresponding are labelled with the same numerals and repeated description thereof is omitted. Furthermore, in the embodiments described below, an example is given in which the invention of the present application is applied to an electric power steering device mounted in a vehicle.

First Embodiment

Figure 1:
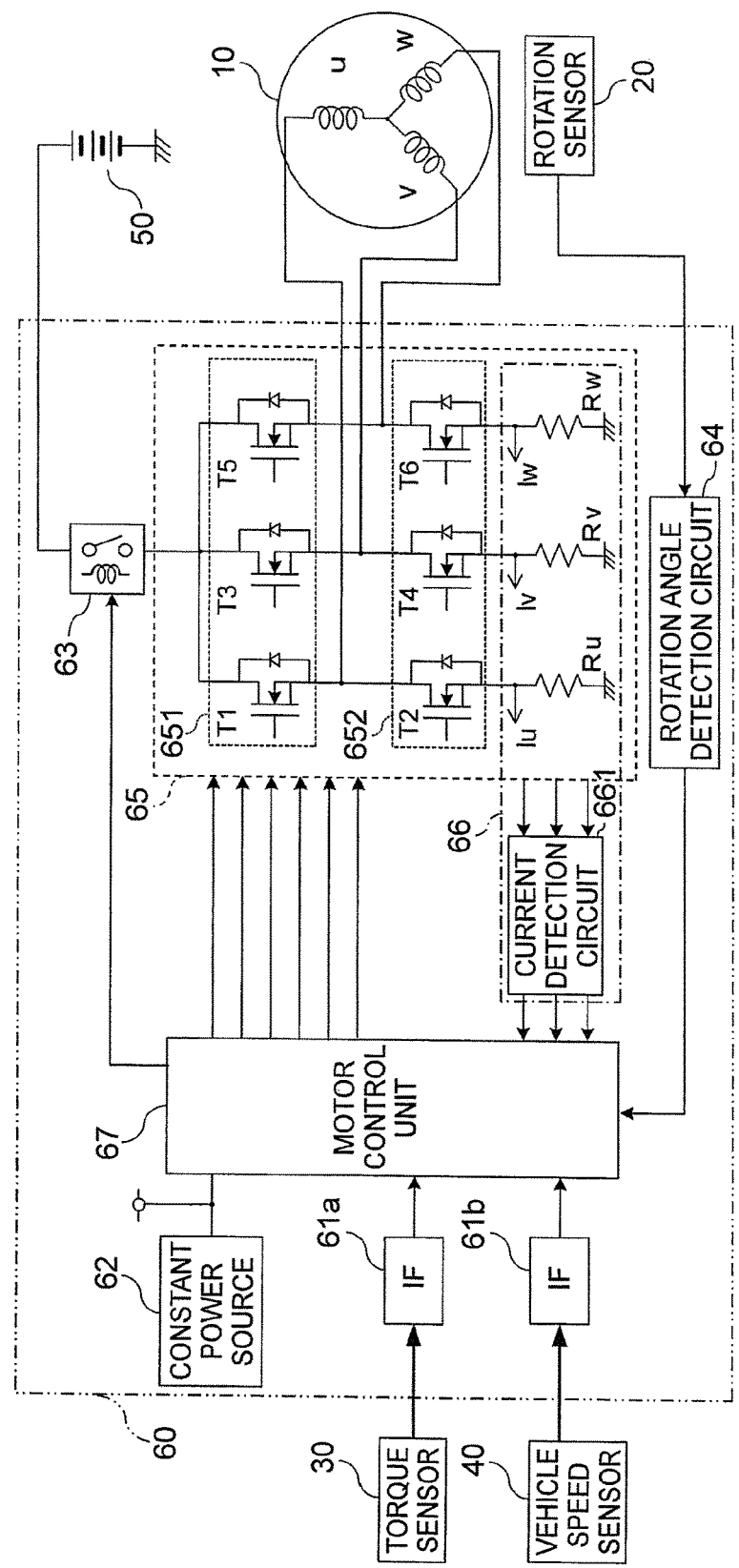
FIG. 1 is a schematic drawing illustrating the configuration of an electric power steering device including a motor control device according to a first embodiment of the present invention.

FIG. 1 is a schematic drawing illustrating the configuration of an electric power steering device including a motor control device 60 according to a first embodiment of the present invention.

In FIG. 1, the electric power steering device is provided with a motor 10, a rotation sensor 20, a torque sensor 30, a vehicle speed sensor 40, a battery 50 and a motor control device 60.

The motor 10 is an electric motor for assisting a steering operation of the vehicle. In the first embodiment, a case is described in which the motor 10 is a three-phase brushless motor having three-phase windings, a u-phase winding, a v-phase winding and a w-phase winding, but the motor 10 may be a multi-phase motor having multi-phase windings.

The rotation sensor 20 serves to detect the rotation angle of the motor 10, and is arranged near the output shaft of the motor 10, for example, so as to be capable of detecting the rotation angle of the motor 10. The torque sensor 30 detects the steering force of the steering wheel of the vehicle. The vehicle speed sensor 40 is a sensor for detecting the speed of the vehicle.

The battery 50 is a drive source of the motor 10 and outputs electric power for driving the motor 10 to the motor control device 60.

The motor control device 60 includes interface circuits (called "IF" below) 61a, 61b, a constant power source 62, a power source relay 63, a rotation angle detection circuit 64, an inverter 65, a current detection unit 66 and a motor control unit 67.

The IF 61a serves to input a detection value from the torque sensor 30 to the motor control unit 67, and the IF 61b serves to input a detection value from the vehicle speed sensor 40 to the motor control unit 67. The constant power source 62 supplies power for driving the motor control unit 67.

The power source relay 63 is disposed between the battery 50 and the inverter 65, and serves to shut off the supply of power from the battery 50 to the inverter 65, as necessary. The rotation angle detection circuit 64 detects the rotation angle of the motor 10 from the rotation sensor 20, and outputs the detected rotation angle of the motor 10 to the motor control unit 67, as a rotation position.

The inverter 65 converts the power input from the battery 50 and outputs the converted power to the motor 10. Furthermore, in the inverter 65, three circuits, each including one switching element on each of an upper-side arm 651 and a lower-side arm 652, are connected in parallel. The three circuits corresponds to the u phase, v phase and w phase of the motor 10, respectively. In other words, the inverter 65 is a three-phase inverter, and six switching elements T1 to T6 are connected in a bridge configuration so as to switch the passage of current respectively to the u-phase winding, the v-phase winding and the w-phase winding of the motor 10.

More specifically, the switching element T1 on the upper-side arm 651 and the switching element T2 on the lower-side arm 652 are connected in series so as to correspond to the u phase of the motor 10. Furthermore, the switching element T3 on the upper-side arm 651 and the switching element T4 on the lower-side arm 652 are connected in series so as to correspond to the v phase of the motor 10. Moreover, the switching element T5 on the upper-side arm 651 and the switching element T6 on the lower-side arm 652 are connected in series so as to correspond to the w phase of the motor 10.

In the first embodiment, a case is described in which the inverter 65 is a three-phase inverter, but the inverter may also be a multi-phase inverter other than a three-phase inverter. Furthermore, for the switching elements T1 to T6, it is possible to use MOSFETs, which are one type of field effect transistor, or to use transistors other than MOSFETs, or IGBTs, etc.

The current detection unit 66 is connected to the switching elements T2, T4, T6 of the lower-side arm 652, and detects the currents flowing in the u phase, the v phase and the w phase of the motor 10, as a u-phase current Iu, a v-phase current Iv and a w-phase current Iw. Furthermore, the current detection unit 66 outputs the detected u-phase current Iu, v-phase current Iv and w-phase current Iw, to the motor control unit 67, as respective phase currents.

Furthermore, the current detection unit 66 has a shunt resistance Ru which is connected in series with the switching element T2, a shunt resistance Rv which is connected in series with the switching element T4, a shunt resistance Rw which is connected in series with the switching element T6, and a current detection circuit 661 to which upstream-side terminals of the shunt resistances Ru, Rv, Rw are respectively connected independently. The current detection circuit 661 detects the u-phase current Iu flowing in the shunt resistance Ru, the v-phase current Iv flowing in the shunt resistance Rv, and the w-phase current Iw flowing in the shunt resistance Rw, and outputs same as respective phase currents to the motor control unit 67.

The motor control unit 67 is configured using a CPU, for example. The motor control unit 67 calculates a current command, which is a command for the current to be supplied to the motor 10, by using the detection value of the torque sensor 30 input from the IF 61*a* and the detection value of the vehicle speed sensor 40 input from the IF 61*b*.

The motor control unit 67 calculates a motor control amount for controlling driving of the motor 10, by carrying out feedback control using the calculated current command, the respective phase currents input from the current detection unit 66, and a rotation position input from the rotation angle detection circuit 64. More specifically, by carrying out feedback control of this kind, the motor control unit 67 calculates a motor control amount for controlling switching of the switching elements T1 to T6 of the inverter 65 by a PWM (Pulse Width Modulation) method.

Furthermore, the motor control unit 67 outputs the calculated motor control amount to the inverter 65. In the feedback control by the motor control unit 67, the current supply timing to the three-phase winding of the motor 10, in other words, the control timing of the inverter 65, is determined in accordance with the rotation position input from the rotation angle detection circuit 64. In this way, when the motor control amount is input to the inverter 65 from the motor control unit 67, the respective switching elements T1 to T6 of the inverter 65 repeat on driving and off driving by a PWM method, in accordance with the input motor control amount.

Moreover, if a failure in the inverter 65 and other peripheral components is detected, the motor control unit 67 shuts off the supply of power from the battery 50 to the inverter 65 by opening the power source relay 63, as necessary.

In switching control, the motor control unit 67 has a first drive mode and a second drive mode. The motor control unit 67 controls switching in accordance with these drive modes, when determining the presence or absence of a failure of the inverter 65. Hereinafter, a failure of the inverter 65 is called an "inverter system failure".

Here, the first drive mode is a mode for controlling switching so that the switching elements T2, T4, T6 on the lower-side arm 652 are all switched on, and furthermore the switching elements T1, T3, T5 on the upper-side arm 651 are all switched off. Furthermore, the second drive mode is a mode for controlling switching so that the switching elements T1, T3, T5 on the upper-side arm 651 are all switched on, and furthermore the switching elements T2, T4, T6 on the lower-side arm 652 are all switched off. In general, the first drive mode and the second drive mode of this kind may be provided in a conventional motor control unit. In this case, the conventional motor control unit carries out switching control in accordance with the first drive mode in order to control the current by detecting the current flowing in the motor, and carries out switching control in accordance with the second drive mode in order to control the current by detecting offset error in the current detector. Consequently, when the invention according to the present application is applied to a conventional motor control unit which is provided with the first drive mode and the second drive mode, it is possible to use the first drive mode and the second drive mode, which are already present, for detection of an inverter system failure.

Furthermore, the motor control unit 67 detects an inverter system failure on the basis of the respective phase currents detected by the current detection unit 66 when switching control is carried out in accordance with the first drive mode, and the respective phase currents detected by the current detection unit 66 when switching control is carried out in accordance with the second drive mode. Hereinafter, the respective phase currents detected by the current detection unit 66 when switching control is carried out in accordance with the first drive mode are called the first failure detection current, and the respective phase currents detected by the current detection unit 66 when switching control is carried out in accordance with the second drive mode are called the second failure detection current.

Here, the inverter system failure means a shorting failure of the switching elements in the inverter 65 and a current sensor system failure. Furthermore, a current sensor system failure means a failure wherein the respective phase currents detected by the current detection unit 66 show an abnormal value rather than a normal value. More specifically, a current sensor system failure also includes an open circuit failure of the switching elements in the inverter 65 and disconnection of the windings of the motor 10, as well as failure of the shunt resistances Ru, Rv, Rw of the inverter 65 and failure of the current detection circuit 661 (for example, a failure such as disconnection or output incapacity).

Next, the detection of an inverter system failure by the motor control unit 67 is described in detail with reference to FIG. 2A. FIG. 2A is an illustrative diagram depicting the details of detection of an inverter system failure by the motor control unit 67 according to the first embodiment of the present invention.

By checking the first failure detection current, the motor control unit 67 carries out a first failure determination to determine whether or not a first failure determination condition has been established. In other words, in the first failure determination, the motor control unit 67 determines whether or not the sum of the phase currents in the first failure detection current is 0 (in other words, Iu+Iv+Iw=0). If the sum of the phase currents in the first failure detection current is 0, then the motor control unit 67 determines that the first failure determination condition is "established" and if the sum is not 0, then the motor control unit 67 determines that the first failure determination condition is "not established".

Furthermore, by checking the second failure detection current, the motor control unit 67 carries out a second failure determination to determine whether or not a second failure determination condition has been established. In other words, in the second failure determination, the motor control unit 67 determines whether or not each of the phase currents in the second failure detection current is 0 (in other words, Iu=Iv=Iw=0). If each of the phase currents in the second failure detection current is 0, then the motor control unit 67 determines that the second failure determination condition is "established" and if each of the phase currents is not 0, then the motor control unit 67 determines that the second failure determination condition is "not established".

In this respect, the establishment condition set for the first failure determination condition is that the sum of the phase currents in the first failure detection current is 0, but the establishment condition may also be that the sum of the phase currents in the first failure detection current is within the range of a first threshold value. In this case, the first threshold value range may be set in advance such that the first threshold value range includes a value of 0, for instance.

Furthermore, the establishment condition set for the second failure determination condition is that each of the phase currents in the second failure detection current is 0, but the establishment condition may also be that each of the phase currents in the second failure detection current is within the range of a second threshold value. In this case, the second threshold value range may be set in advance such that the second threshold value range includes a value of 0, for instance.

By carrying out the first failure determination and the second failure determination, the motor control unit 67 obtains results of four types, as depicted in FIG. 2A. More specifically, result A to result D indicated below are obtained.

Result A: first failure determination condition "established"; second failure determination condition "established"

Result B: first failure determination condition "established"; second failure determination condition "not established"

Result C: first failure determination condition "not established"; second failure determination condition "established"

Result D: first failure determination condition "not established"; second failure determination condition "not established"

Firstly, if result A is obtained, then the motor control unit 67 determines that an inverter system failure has not occurred, in other words, that the operation of the switching elements in the inverter 65 and the detection result from the current detection unit 66 are both normal.

Here, a case where switching control is carried out in accordance with the first drive mode, with the inverter 65 and the current detection unit 66 in a normal state is assumed. In this case, the phase currents flowing in the motor 10 are three-phase alternating currents and since the three phases are balanced, the sum of the phase currents in the first failure detection current is 0, and the first failure determination condition is to be established.

Furthermore, a case where switching control is carried out in accordance with the second drive mode, with the inverter 65 and the current detection unit 66 in a normal state is assumed. In this case, the current flowing between the motor 10 and the inverter 65 does not flow through the switching elements T2, T4, T6 on the lower-side arm 652, and therefore each of the phase currents in the second failure detection current is 0, and the second failure determination condition is to be established.

Consequently, when result A is obtained, the motor control unit 67 determines that both the inverter 65 and the current detection unit 66 are normal.

Secondly, when result B is obtained, the motor control unit 67 determines that a shorting failure has occurred in the switching elements T2, T4, T6 on the lower-side arm 652, as an inverter system failure. Below, a shorting failure of the switching elements T2, T4, T6 on the lower-side arm 652 is called a lower-arm shorting failure.

Here, a case where switching control is carried out in accordance with the first drive mode in a state where a lower-arm shorting failure has occurred is assumed. In this case, since the switching elements T2, T4, T6 on the lower-side arm 652 are controlled so as to be on, then the first failure determination condition is to be established, similarly to the case of result A.

Furthermore, a case where switching control is carried out in accordance with the second drive mode in a state where a lower-arm shorting failure has occurred is assumed. In this case, the power source is shorted via the switching element in which the shorting failure has occurred, and the switching element on the upper-side arm 651 which forms a pair with that switching element, and this results in the flow of an excessively large current that does not pass through the windings of the motor 10. Therefore, the current of the phase corresponding to the switching element in which the shorting failure has occurred, among the respective phase currents in the second failure detection current, will not be 0, and hence the second failure determination condition is not to be established.

Consequently, when result B is obtained, the motor control unit 67 determines that a lower-arm shorting failure has occurred.

Thirdly, when result C is obtained, the motor control unit 67 determines that a shorting failure has occurred in the switching elements T1, T3, T5 on the upper-side arm 651, as an inverter system failure. Below, a shorting failure of the switching elements T1, T3, T5 on the upper-side arm 651 is called an upper-arm shorting failure.

Here, a case where switching control is carried out in accordance with the first drive mode in a state where an upper-arm shorting failure has occurred is assumed. In this case, the power source is shorted via the switching element in which the shorting failure has occurred, and the switching element on the lower-side arm 652 which forms a pair with that switching element, and this results in the flow of an excessively large current that does not pass through the windings of the motor 10. Therefore, the sum of the phase currents in the first failure detection current will not be 0, and hence the first failure determination condition is not to be established.

Furthermore, a case where switching control is carried out in accordance with the second drive mode in a state where an upper-arm shorting failure has occurred is assumed. In this case, since the switching elements T1, T3, T5 on the upper-side arm 651 are controlled so as to be on, then the second failure determination condition is to be established, similarly to the case of result A.

Consequently, when result C is obtained, the motor control unit 67 determines that an upper-arm shorting failure has occurred.

Fourthly, when result D is obtained, the motor control unit 67 determines that a current sensor system failure has occurred, as an inverter system failure.

Here, if switching control according to the first drive mode and switching control according to the second drive mode is carried out in a state where a shorting failure has occurred in the switching elements, then as described above, either one of the first failure determination condition and the second failure determination condition is established, and the other thereof is not established. Therefore, a situation where both the first failure determination condition and the second failure determination condition are not established could apply to a case where a current sensor system failure has occurred, rather than the occurrence of a shorting failure in the switching elements, as an inverter system failure.

Consequently, when result D is obtained, the motor control unit 67 determines that a current sensor system failure has occurred, as an inverter system failure.

As described above, the motor control unit 67 can determine that a shorting failure in the switching elements has occurred, as an inverter system failure, if either one of the first failure determination condition and the second failure determination condition is established and the other thereof is not established.

Furthermore, the motor control unit 67 can determine that a current sensor system failure has occurred, as an inverter system failure, if both of the first failure determination condition and the second failure determination condition are not established.

Next, the identification of the current detection abnormality phase, which is carried out further by the motor control unit 67 when it has been determined that a current sensor system failure has occurred, will be described with reference to FIG. 2B. FIG. 2B is an illustrative diagram depicting a method for identifying the current detection abnormality phase when a current sensor system failure has been detected by the motor control unit 67 according to the first embodiment of the present invention.

As illustrated in FIG. 2B, two types of failure pattern can be envisaged for a current sensor system failure.

In a failure pattern 1, there is a case where there is a phase in which the current value is not 0 but rather an abnormal value other than 0, among the respective phase currents in the second failure detection current. In this case, the motor control unit 67 identifies the phase in which the current value is an abnormal value, as the current detection abnormality phase.

Here, if switching control is carried out in accordance with the second drive mode, in a state where an inverter system failure has not occurred, then the respective phase currents in the second failure detection current are each to be 0. Consequently, the motor control unit 67, upon determining that a current sensor system failure has occurred as an inverter system failure, identifies the phase in which the current value is an abnormal value, among the respective phase currents in the second failure detection current, as the current detection abnormality phase. Here, the phase in which the current value is not 0 but rather an abnormal value other than 0 is identified as a current detection abnormality phase, but it is also possible to adopt a configuration wherein a phase in which the current value is not within the range of a third threshold value is identified as the current detection abnormality phase. In this case, the third threshold value range may be set in advance such that the third threshold value range includes a value of 0, for instance.

In a failure pattern 2, there is a case where there is a phase in which the current value is 0 (more specifically, a phase where the current value is fixed to 0 for a prescribed time or longer), among the respective phase currents in the first failure detection current. In this case, the motor control unit 67 identifies the phase in which the current value is 0, as the current detection abnormality phase.

Here, if switching control is carried out in accordance with the first drive mode, in a state where an inverter system failure has not occurred, then the sum of the phase currents in the first failure detection current is to be 0, and the phase currents each are not to be 0. Consequently, the motor control unit 67, upon determining that a current sensor system failure has occurred as an inverter system failure, identifies the phase in which the current value is 0, among the respective phase currents in the first failure detection current, as the current detection abnormality phase. Here, the phase in which the current value is 0 is identified as a current detection abnormality phase, but it is also possible to adopt a configuration wherein a phase in which the current value is within the range of a fourth threshold value is identified as the current detection abnormality phase. In this case, the fourth threshold value range may be set in advance such that the fourth threshold value range includes a value of 0, for instance.

In this way, the motor control unit 67, upon determining that a current sensor system failure has occurred, can identify the current detection abnormality phase by checking the phase currents in the first failure detection current and the phase currents in the second failure detection current.

Furthermore, the current values are normal in the normal phases, which are the other phases apart from the current detection abnormality phase identified by the motor control unit 67. Therefore, when there is one current detection abnormality phase, driving of the motor 10 is controlled by using the current values of the normal phases which are detected by the current detection unit 66. Various methods using prior art technology can be envisaged for the specific method of controlling the driving of the motor 10, by using the current values of the normal phases detected by the current detection unit 66, and a method such as that described below can be cited.

More specifically, the current values of the normal phases detected by the current detection unit 66 are used to calculate the current flowing in the current detection abnormality phase by Formula (1) below, in which the sum of the current values of the respective phases is 0.

$$Iu+Iv+Iw=0 \quad (1)$$

The motor control unit 67 can calculate the precise current flowing in the current detection abnormality phase in accordance with Formula (1), by using the currents of the normal phases detected by the current detection unit 66. As a result of this, the motor control unit 67 does not have to control the driving of the motor 10 by using the current of the current detection abnormality phase detected by the current detection unit 66.

Consequently, even if there is one current detection abnormality phase, the motor control unit 67 is able to calculate the motor control amount by using the calculated current of the current detection abnormality phase and the current of the normal phase which is detected by the current detection unit 66. Therefore, the motor control unit 67 is able to continue drive control of the motor 10, even if a current sensor system failure has occurred. Furthermore, a special program for failure response is not required for the calculation and output of the motor control amount. The method given above was described as one example of a specific method in which driving of the motor 10 is controlled by using the current values of the normal phases which are detected by the current detection unit 66. However, for example, it is also possible to calculate the motor control amount by directly converting the currents of the normal phases detected by the current detection unit 66 into d-axis and q-axis values, rather than calculating the current flowing in the current detection abnormality phase on the basis of Formula (1) above.

Next, the timing at which the switching control based on the first drive mode and the second drive mode is carried out will be described with reference to FIG. 3. FIG. 3 is an illustrative diagram depicting one example of the timing at which switching control based on the first drive mode and the second drive mode is carried out by the motor control unit 67 of the first embodiment of the present invention.

As illustrated in FIG. 3, the motor control unit 67 carries out switching control for the respective phases in accordance with the first drive mode, the second drive mode or another mode. The time ranges of the depicted time periods A1, B1, A2, B2, A3 indicate the minimum time range required by the motor control unit 67 to read in the first failure detection current or the second failure detection current. This time range is determined by taking all of the operational delays of the inverter 65, the current detection circuit 661 and the motor control unit 67 into consideration, and can be set to approximately 10 μsec, for example.

Furthermore, as illustrated in FIG. 3, there are two types of time period: the time period for reading in the detected first failure detection current when carrying out switching control in accordance with the first drive mode and the time period for reading in the second failure detection current when carrying out switching control in accordance with the second drive mode. Furthermore, the first failure determination and the second failure determination described above are carried out by using the first failure detection current and the second failure detection current which are read in this way.

Here, the motor control unit 67 carries out switching control in accordance with the other mode, after carrying out switching control in accordance with the second drive mode in time period A1, for example. Furthermore, the motor control unit 67 carries out switching control in accordance with the other mode, after carrying out switching control in accordance with the first drive mode in time period B1, for example. Moreover, the motor control unit 67 carries out switching control in accordance with the other mode, after carrying out switching control in accordance with the second drive mode in time period A2, for example. The other mode referred to here is a mode in which all of the switching elements T1 to T6 are switched off.

Furthermore, the motor control unit 67 carries out switching control in accordance with another mode, after carrying out switching control in accordance with the first drive mode in time period B2, for example. Moreover, the motor control unit 67 carries out switching control in accordance with the other mode, after carrying out switching control in accordance with the second drive mode in time period A3, for example. The other mode referred to here is a mode for controlling the switching elements T1 to T6 by a PWM method, in order to carry out normal drive control of the motor 10.

In this way, the switching control in accordance with the first drive mode and the second drive mode can be set so as to be carried out while drive control of the motor 10 is not being carried out, and can also be set so as to be carried out while drive control of the motor 10 is being carried out.

Figure 4:
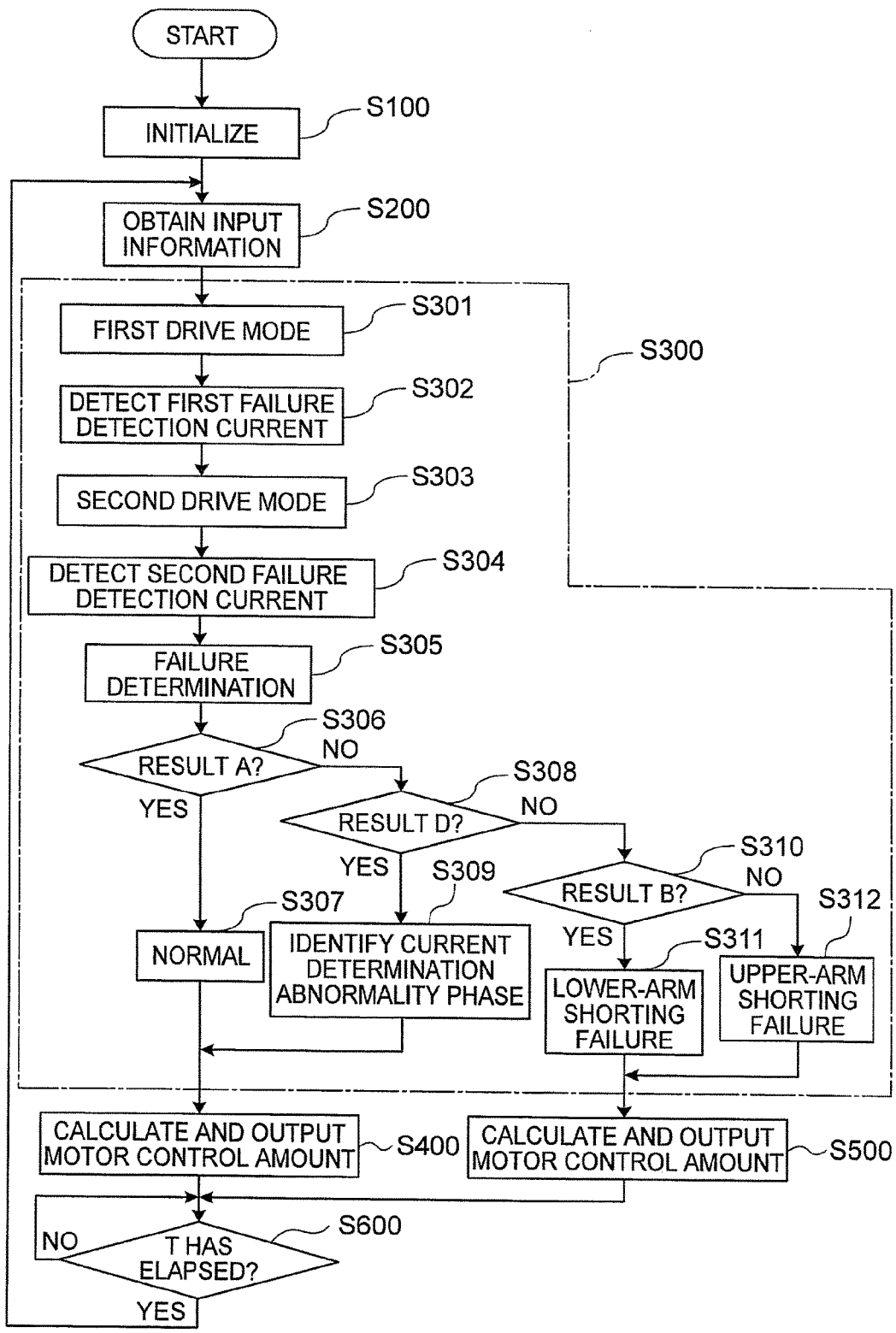
FIG. 4 is a flowchart showing a series of operations of the motor control unit in the first embodiment of the present invention.

Next, the series of operations by the motor control unit 67 will be described with reference to FIG. 4. FIG. 4 is a flowchart showing a flow of a series of operations of the motor control unit 67 in the first embodiment of the present invention.

When power is supplied to the motor control unit 67 from the constant power source 62, in step S100, the motor control unit 67 is initialized and then advances to step S200. More specifically, the motor control unit 67 carries out processes, such as checking the ROM and RAM, setting ports and resetting flags, etc.

In step S200, the motor control unit 67 acquires various input information and then advances to step S300. Here, the input information is the torque, vehicle speed and rotation speed, etc. and the motor control unit 67 reads in and stores these values.

In step S300, the motor control unit 67 carries out an inverter system failure determination process and then advances to step S400 or step S500, in accordance with the processing results. Here, the step S300 in which the inverter system failure determination process is carried out includes steps S301 to S312. The details of these steps S301 to S312 are described respectively below.

In step S301, the motor control unit 67 switches on all of the switching elements T2, T4, T6 on the lower-side arm 652, in accordance with the first drive mode, and switches off all of the switching elements T1, T3, T5 on the upper-side arm 651, and then advances to step S302. In this case, the power source relay 63 is closed.

In step S302, after a first set time period has elapsed after executing step S301, the motor control unit 67 reads in the phase currents detected by the current detection unit 66, as the first failure detection current, saves the first failure detection current thus read in, and advances to step S303. The first set time period may be set in advance, and may be 10 μsec, for example.

In step S303, the motor control unit 67 switches on all of the switching elements T1, T3, T5 on the upper-side arm 651, in accordance with the second drive mode, and switches off all of the switching elements T2, T4, T6 on the lower-side arm 652, and then advances to step S304.

In step S304, after a second set time period has elapsed after executing step S303, the motor control unit 67 reads in the phase currents detected by the current detection unit 66, as the second failure detection current, saves the second failure detection current thus read in, and advances to step S305. The second set time period may be set in advance, similarly to the first set time period, and may be 10 μsec, for example.

In this way, by executing steps S301 to S304, the motor control unit 67 can obtain the first failure detection current and the second failure detection current, which is information required in order to carry out the first failure determination and the second failure determination.

Next, in step S305, the motor control unit 67 carries out the first failure determination and the second failure determination in accordance with the determination process in FIG. 2A above, by using the first failure detection current acquired in step S302 and the second failure detection current acquired in the step S304, and then advances to step S306.

In step S306, the motor control unit 67 determines whether or not result A has been obtained, as a failure determination result. When determining that the result A has been obtained (in other words, YES), then the motor control unit 67 advances to step S307, and when determining that the result A has not been obtained (in other words, NO), then the motor control unit 67 advances to step S308.

In step S307, the motor control unit 67 determines a normal state and then advances to step S400.

In step S308, the motor control unit 67 determines whether or not result D has been obtained, as a failure determination result. When determining that result D has been obtained (in other words, YES), then the motor control unit 67 advances to step S309, and when determining that result D has not been obtained (in other words, NO), then the motor control unit 67 advances to step S310.

In step S309, the motor control unit 67 determines that a current sensor system failure has occurred, and also identifies the current detection abnormality phase in accordance with the determination process in FIG. 2B above, and then advances to step S400.

In step S310, the motor control unit 67 determines whether or not result B has been obtained, as a failure determination result. When determining that result B has been obtained (in other words, YES), then the motor control unit 67 advances to step S311, and when determining that result B has not been obtained (in other words, NO), then the motor control unit 67 advances to step S312.

In step S311, the motor control unit 67 determines that a lower-arm shorting failure has occurred and then advances to step S500.

In step S312, the motor control unit 67 determines that an upper-arm shorting failure has occurred and then advances to step S500.

In step S400, the motor control unit 67 calculates a motor control amount, outputs same to the inverter 65, and then advances to step S600. Here, if a normal state is determined in step S307, then the motor control unit 67 calculates the motor control amount by using the respective phase currents detected by the current detection unit 66, as normal. On the other hand, if the motor control unit 67 determines that a current sensor system failure has occurred in step S309 and has also identified the current detection abnormality phase, then as described above, the motor control unit 67 calculates the motor control amount by using the calculated current of the current detection abnormality phase and the currents of the normal phases detected by the current detection unit 66.

In step S500, the motor control unit 67 calculates a motor control amount, outputs same to the inverter 65, and then advances to step S600.

More specifically, when the motor control unit 67 executes step S500, there is a large possibility that a switching element has produced a shorting failure, and therefore, it is difficult to control driving of the motor 10 by using the three phases as normal. Consequently, in step S500, the motor control unit 67 may interrupt the drive control of the motor 10 without calculating the motor control amount.

If a switching element suffering a shorting failure can be identified by checking which switching element corresponding to which of the phases is shorted, then it is possible to control the driving of the motor 10 by using only the remaining phases apart from the phase corresponding to the identified switching element. Therefore, in step S500, the motor control unit 67 may calculate a motor control amount for controlling driving of the motor 10 by using only the remaining phases apart from the phase corresponding to the switching element suffering a shorting failure, and output the motor control amount to the inverter 65. For example, if the switching element corresponding to one of the three phases has a shorting failure, then the motor control unit 67 calculates a motor control amount for controlling driving of the motor 10 by using only the two remaining phases, and outputs the motor control amount to the inverter 65.

In step S600, the motor control unit 67 waits until a third set time period T has elapsed after execution of step S200, and when this third set time period T has elapsed, returns to step S200 and executes step S200 onwards again.

In this way, the motor control unit 67 repeats step S200 to S600 at a prescribed cycle T. For example, if the prescribed cycle T is 10 msec, then it is possible to detect an inverter system failure within 10 msec, and driving of the motor 10 is controlled in accordance with the type of inverter system failure, in the next cycle. Consequently, it is possible to achieve rapid failure response control in respect of an inverter system failure.

Above, according to the first embodiment, a configuration is provided wherein a first failure determination for determining whether or not the sum of the currents of the respective phases detected as the first failure detection current is within a previously established first threshold value range, and a second failure determination for determining whether or not each of the currents of the respective phases detected as the second failure detection current is within a previously established second threshold value range, are carried out.

Furthermore, a configuration for detecting an inverter system failure in accordance with the determination results of the first failure determination and the second failure determination is also provided.

Consequently, an inverter system failure is detected by switching control of extremely short duration, in accordance with driving modes of only two types, and therefore it is possible to detect a failure in the inverter circuit simply and rapidly compared to the prior art, and as a result of this, it is possible to achieve a rapid response to a failure in the inverter circuit.

Furthermore, it is possible easily to identify whether any one of a "lower-arm shorting failure", an "upper-arm shorting failure" and a "current sensor system failure" has occurred as an inverter system failure, in response to the determination results of the first failure determination and the second failure determination. Moreover, it is possible to switch to motor control in accordance with the type of failure of the inverter circuit, and transient control of the motor which may possibly be inappropriate can be made as short as possible.

A configuration may be adopted in which the driver of the vehicle is notified by using lights, sounds, etc., when the motor control unit 67 has detected an inverter system failure. Consequently, the driver can be made aware that an inverter system failure has occurred.

Second Embodiment

In the second embodiment, a case is described in which the execution timing of the step S300 is changed in the flowchart of FIG. 4 described above. The processing time of step S300 is extremely short. Therefore, in the second embodiment, step S300 is configured as a subroutine, rather than directly introducing step S300 between the steps of the main routine, as in the flowchart in FIG. 4 described above. As a result of this, it is possible to adopt a configuration wherein step S300 is executed by handling the step S300 subroutine as an interrupt routine and interrupting the main routine to execute step S300 when a particular control process is not being carried out.

In this way, if a configuration is adopted in which the processing in step S300 is carried out by an interrupt while a particular control process is not being carried out, then the motor control unit 67 can carry out failure response control corresponding to the type of inverter system failure, at a cycle shorter than the prescribed cycle T of the main routine. Consequently, it is possible to control driving of the motor 10 in accordance with the type of inverter system failure, at least in the next cycle, and it is possible to achieve an even more rapid response to the inverter system failure.

It is also possible to configure only steps S301 to S304 which are included in step S300 as an interrupt routine, and to leave steps S305 to S312 in the main routine, as in FIG. 4 described above. Furthermore, the motor control unit 67 executes step S302 when a first set time period has elapsed after execution of step S301, and executes step S304 when a second set time period has elapsed after execution of step S303. Therefore, it is possible to adopt a configuration wherein, during the waiting time period until the set time periods have elapsed, the procedure returns again to the main routine, the processing of the main routine is carried out until the set time periods have elapsed, and after the set time periods have elapsed, the procedure enters the interrupt routine again.

As described above, by configuring all or a portion of the steps included in step S300 as an interrupt routine, the processing time of each routine can be used efficiently.

Furthermore, in the processing of the interrupt routine, it is possible to change the sequence of the switching control in accordance with the first drive mode and the switching control in accordance with the second drive mode, for example, by taking into consideration the drive control of the motor 10 currently being carried out. Accordingly, it is possible to reduce the number of on and off switching operations of the switching elements, and as a result of this, it is possible to suppress the switching noise.

Third Embodiment

Figure 5:
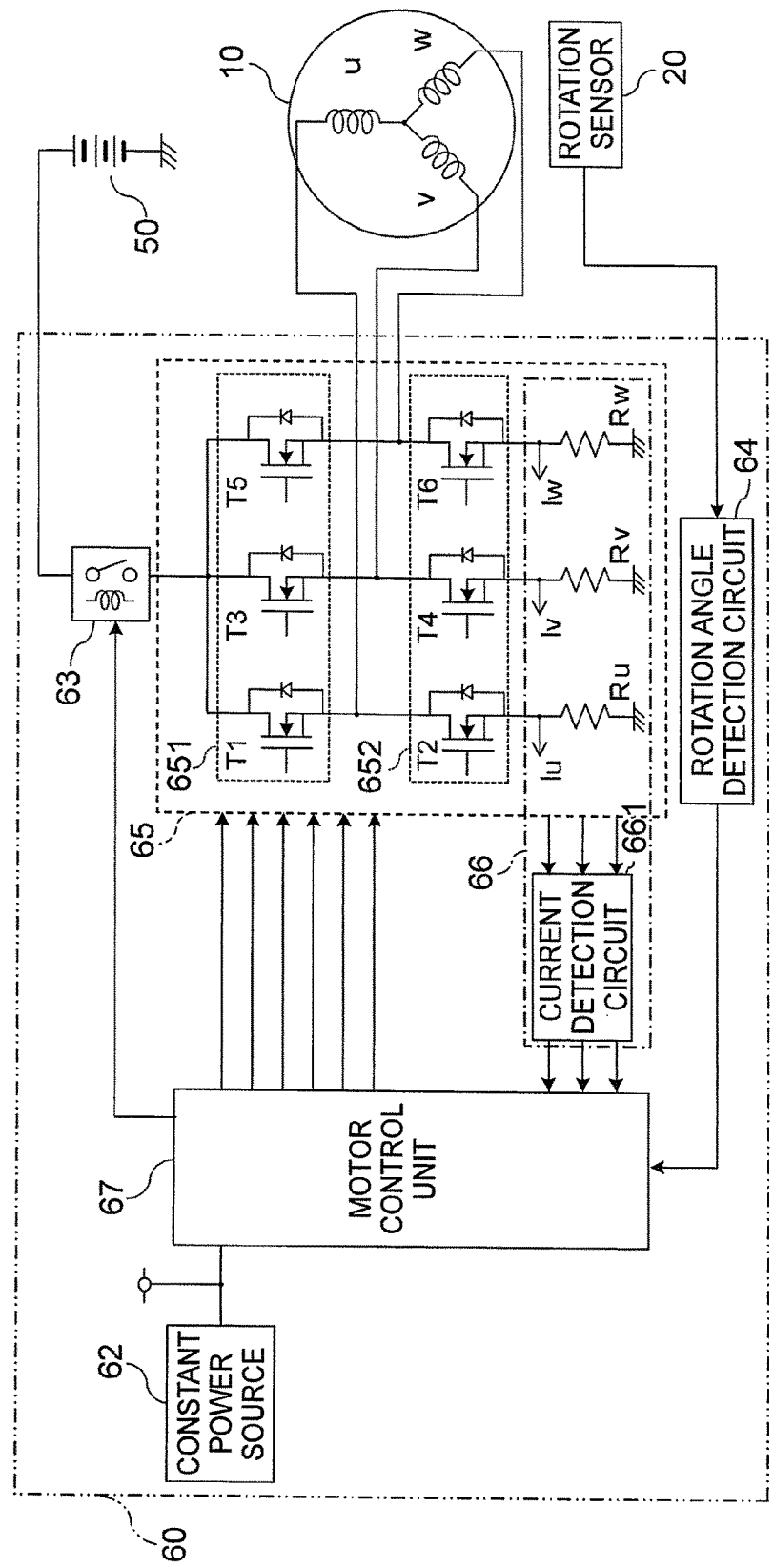
FIG. 5 is a schematic drawing illustrating the configuration of an electric power steering device including a motor control device according to a third embodiment of the present invention.

In the third embodiment, as shown in FIG. 5, a case is described in which an electric power steering device is configured by omitting the torque sensor 30, the vehicle speed sensor 40 and the IFs 61a, 61b, compared to the electric power steering device of the first embodiment described above.

FIG. 5 is a schematic drawing illustrating the configuration of an electric power steering device including a motor control device 60 according to the third embodiment of the present invention. Here, the points which are the same as the first embodiment described above are not explained and the points which are different from the first embodiment will be explained.

In the first embodiment, the motor control unit 67 calculates a current command, which is a command for the current to be supplied to the motor 10, on the basis of information from the torque sensor 30 and the vehicle speed sensor 40. On the other hand, in the third embodiment of the present invention, the motor control unit 67 calculates a current command by carrying out proportional integration control on the basis of a rotation angle command and a deviation in the rotation angle. By calculating the current command in this way, it is possible to carry out control such that the rotation angle of the motor 10 follows the rotation angle command.

As described above, according to the third embodiment, the only difference from the first embodiment is the method for generating the current command, and the detection of an inverter system failure is the same as the first embodiment. Consequently, it is possible to obtain similar beneficial effects to the first embodiment, by adopting a simple configuration which omits the torque sensor 30, the vehicle speed sensor 40, and the IFs 61a, 61b.

In the third embodiment, a case is described in which the current command is generated by controlling the rotation angle of the motor 10, but the invention is not limited to this, and a configuration may be adopted in which a control command is calculated on the basis of control of the rotation speed and the motor is caused to follow the rotation speed command. In this case also, the only difference with respect to the first embodiment is the method for generating a current command, and therefore similar beneficial effects to the first embodiment are obtained.

The invention claimed is:

1. A motor control device which controls driving of a motor having multiple-phase windings by using detection values of currents flowing in respective phases of the motor, the motor control device comprising:
    an inverter in which a plurality of circuits, each having switching elements respectively on an upper-side arm and a lower-side arm, are connected in parallel, and which supplies power to the motor;
    a motor control unit which controls driving of the motor by controlling the inverter; and
    a current detection unit which is connected to each of the switching elements on the lower-side arm and which detects the current in each of the phases,
    wherein the motor control unit has:
        a first drive mode in which switching control is carried out to switch on all of the switching elements on the lower-side arm, and to switch off all of the switching elements on the upper-side arm; and
        a second drive mode in which switching control is carried out to switch on all of the switching elements on the upper-side arm, and to switch off all of the switching elements on the lower-side arm, and
    the motor control unit:
        carries out a first failure determination for determining whether or not a sum of the currents of the respective phases detected as a first failure detection current by the current detection unit is within a previously established first threshold value range, when switching control is carried out in accordance with the first drive mode;
        carries out a second failure determination for determining whether or not the currents of the respective phases, detected as a second failure detection current by the current detection unit, are of equal value, the equal value being within a previously established second threshold value range, when switching control is carried out in accordance with the second drive mode; and
        detects an inverter system failure in accordance with the determination results of the first failure determination and the second failure determination.

2. The motor control device according to claim 1, wherein the motor control unit determines that, as the inverter system failure, a shorting failure of the switching elements on the lower-side arm has occurred, when determining, in the first failure determination, that the sum of the currents of the respective phases detected as the first failure detection current is within the first threshold value range, and when determining, in the second failure determination, that each of the currents of the respective phases detected as the second failure detection current is not within the second threshold value range.

3. The motor control device according to claim 1, wherein the motor control unit determines that, as the inverter system failure, a shorting failure of the switching elements on the upper-side arm has occurred, when determining, in the first failure determination, that the sum of the currents of the respective phases detected as the first failure detection current is not within the first threshold value range, and when determining, in the second failure determination, that each of the currents of the respective phases detected as the second failure detection current is within the second threshold value range.

4. The motor control device according to claim 1, wherein the motor control unit determines that, as the inverter system failure, a current sensor system failure has occurred, when determining, in the first failure determination, that the sum of the currents of the respective phases detected as the first failure detection current is not within the first threshold value range, and when determining, in the second failure determination, that each of the currents of the respective phases detected as the second failure detection current is not within the second threshold value range.

5. The motor control device according to claim 4, wherein the motor control unit identifies, as a current detection abnormality phase, a phase in which a current that is not within a previously established third threshold value range, among the currents of the respective phases detected as the second failure detection current, is detected, or a phase in which a current included in a previously established fourth threshold value range, among the currents of the respective phases detected as the first failure detection current, is detected.

6. The motor control device according to claim 5, wherein when there is one identified current detection abnormality phase, the motor control unit controls driving of the motor by using the currents of normal phases, which are phases other than the current detection abnormality phase among the respective phases detected by the current detection unit.

7. An electric power steering device comprising:
the motor control device according to claim 1; and
a motor having multiple-phase windings controlled by the motor control device.

8. An inverter system failure detection method which is executed by a motor control device including an inverter in which a plurality of circuits, each having switching elements respectively on an upper-side arm and a lower-side arm, are connected in parallel, and which supplies power to a motor, and a current detection unit which is connected to each of the switching elements on the lower-side arm and which detects currents in respective phases of the motor, the method comprising:
a step of carrying out first failure determination for determining whether or not a sum of the currents of the respective phases detected as a first failure detection current by the current detection unit is within a first threshold value range, when all of the switching elements on the lower-side arm are switched on and all of the switching elements on the upper-side arm are switched off;
a step of carrying out second failure determination for determining whether or not the currents of the respective phases, detected as a second failure detection current by the current detection unit, are of equal value, the equal value being within a second threshold value range, when all of the switching elements on the upper-side arm are switched on and all of the switching elements on the lower-side arm are switched off; and
a step of detecting an inverter system failure in accordance with the determination results of the first failure determination and the second failure determination.

\* \* \* \* \*